United States Patent
Marinov

(10) Patent No.: US 9,140,758 B2
(45) Date of Patent: Sep. 22, 2015

(54) METHOD AND DEVICE FOR INDICATING AN ELECTRIC DISCHARGE INSIDE A BEARING OF AN ELECTRIC DRIVE SYSTEM

(75) Inventor: Pavlik Marinov, Neuenhof (CH)

(73) Assignee: AKTIEBOLAGET SKF, Gothenburg (SE)

(*) Notice: Subject to any disclaimer, the term of this patent is extended or adjusted under 35 U.S.C. 154(b) by 1062 days.

(21) Appl. No.: 12/225,077

(22) PCT Filed: Mar. 12, 2007

(86) PCT No.: PCT/SE2007/000231
§ 371 (c)(1),
(2), (4) Date: Aug. 10, 2009

(87) PCT Pub. No.: WO2007/106015
PCT Pub. Date: Sep. 20, 2007

(65) Prior Publication Data
US 2009/0302864 A1     Dec. 10, 2009

(30) Foreign Application Priority Data
Mar. 13, 2006 (EP) .................................... 06111036

(51) Int. Cl.
G01N 27/00 (2006.01)
G01R 31/34 (2006.01)
G01R 31/12 (2006.01)

(52) U.S. Cl.
CPC .......... *G01R 31/343* (2013.01); *G01R 31/1263* (2013.01)

(58) Field of Classification Search
CPC ............. G01R 31/343; G01R 31/1263; G01R 27/025; G01N 27/205

USPC ......................................................... 324/557
See application file for complete search history.

(56) References Cited

U.S. PATENT DOCUMENTS

| 4,577,151 A | 3/1986 | Tanisaka et al. |
| 4,731,586 A | 3/1988 | Perkins |

(Continued)

FOREIGN PATENT DOCUMENTS

| WO | WO03060536 A1 | 7/2003 |
| WO | WO2005314314 | 7/2003 |

(Continued)

OTHER PUBLICATIONS

WISC Magnetic Field and Current, Physics 202, Lecture 13, p. 1-10.*

(Continued)

*Primary Examiner* — Thomas F Valone
(74) *Attorney, Agent, or Firm* — Bryan Peckjian; SKF USA Inc.

(57) ABSTRACT

The present invention relates to a method for indicating an electric discharge in a non-conducting medium (22) between a rolling element (20) and a raceway (16, 18) in a bearing (12) of an electric drive system (10). The method comprises: remotely detecting radio frequency signals emitted from the electric drive system, which signals comprise a radio frequency signal associated with an electrical discharge in the non-conducting medium, processing the detected radio frequency signals to estimate the electric discharge, and indicating the estimated electric discharge. The present invention also relates to a corresponding device (30, 50, 70, 90) for indicating an electric discharge in a non-conducting medium between a rolling element and a raceway in a bearing of an electric drive system.

19 Claims, 2 Drawing Sheets

(56) References Cited

U.S. PATENT DOCUMENTS

Figure 1:
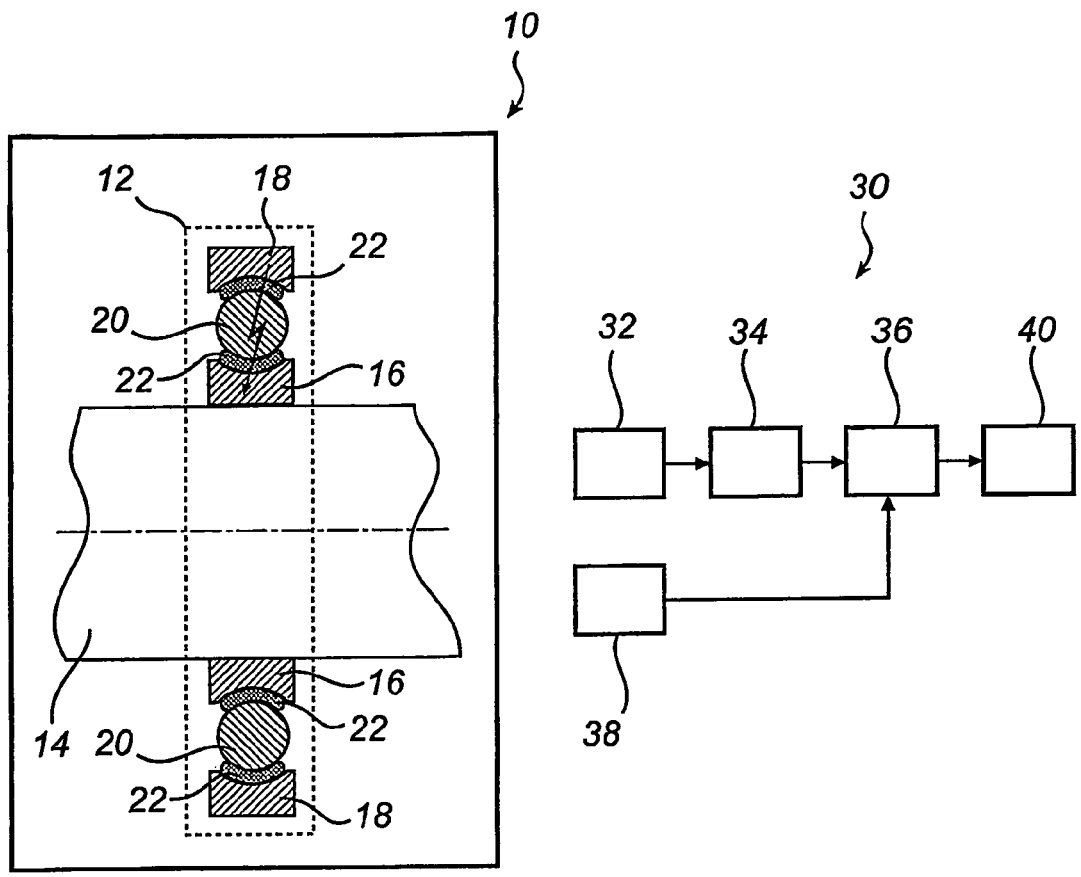

| | | | |
|---|---|---|---|
| 5,810,963 A * | 9/1998 | Tomioka | 156/345.28 |
| 6,313,640 B1 * | 11/2001 | Nasrallah et al. | 324/536 |
| 6,661,235 B2 * | 12/2003 | Rokunohe et al. | 324/536 |
| 6,937,027 B2 * | 8/2005 | Koo et al. | 324/536 |
| 2003/0214307 A1 * | 11/2003 | Kang et al. | 324/536 |
| 2004/0056543 A1 * | 3/2004 | Melfi | 310/68 R |
| 2005/0104616 A1 * | 5/2005 | Cullen et al. | 324/772 |
| 2005/0184751 A1 | 8/2005 | Hobelsberger et al. | |

FOREIGN PATENT DOCUMENTS

| | | |
|---|---|---|
| WO | WO03060536 | 4/2005 |
| WO | WO2005034314 A1 | 4/2005 |

OTHER PUBLICATIONS

IBSCO—Ball Bearing Terminology—p. 1-7, http://www.ibsco.com/ball-bearing-terminology.php.*

Hu, "Analysis of signal characteristic and resolution in ground forward scattering radar" ICSP2010 Proceedings, p. 1969-1972.*

Ahola et al., Radio-frequency-based detection of electrical discharge machining bearing currents, IET Electric Power Applications, 2011, V. 5, No. 4, p. 386-392.*

WISC Magnetic Field and Current, Physics 202, Lecture 13, p. 1-10, no date.*

IBSCO—Ball Bearing Terminology—p. 1-7, http://www.ibsco.com/ball-bearing-terminology.php, no date.*

Muetze A., et al. Techniques for Measurement of Parameters Related to Inverter-Induced Bearing Currents Conference Record of the 2005 IEEE Industry Applications Conference Fortieth IAS Annual Meeting (IEEE cat. No. 05CH37695), 2005, IEEE, Piscataway, NJ, USA; ISBN 0-7803-9208-6; vol. 2, pp. 1390-1397.

Von Jouane A., et al. An Evaluation of Mitigation Techniques for Bearing Currents, EMI and Overvoltages in ASD Applications IEEE Transactions on Industry Applications Sep.-Oct. 1998, IEEE, USA; doi: 10.1109/28-720452; ISSN 0093-9994; vol. 34, No. 5, pp. 1113-1122.

ABB Automation Group Ltd. Technical Guide No. 5 Bearing Currents in Modern AC Drive Systems Finland, 1999.

A. Muetz, Techniques for Measurement of Parameters Related to Inverter-Induced Bearing Currents, Oct. 24, 2005, pp. 1390-1397, vol. 2.

Department of Electrical Energy, Conversion, Darmstadt University of Technology, Darmstadt, 64283, Germany.

A. Von Jouanne, An Evaluation of Mitigation Techniques for Bearing Currents, EMI and Overvoltages in ASD Applications, Aug. 6, 2002, pp. 1113-1122,, vol. 34—issue 5.

Annette von Jouannne, Member, IEEE, and Alan K. Wallace, Senior Member, IEEE, Department of Electr. & Compt. Eng., Oregon State Univ., Corvallis, OR.

* cited by examiner

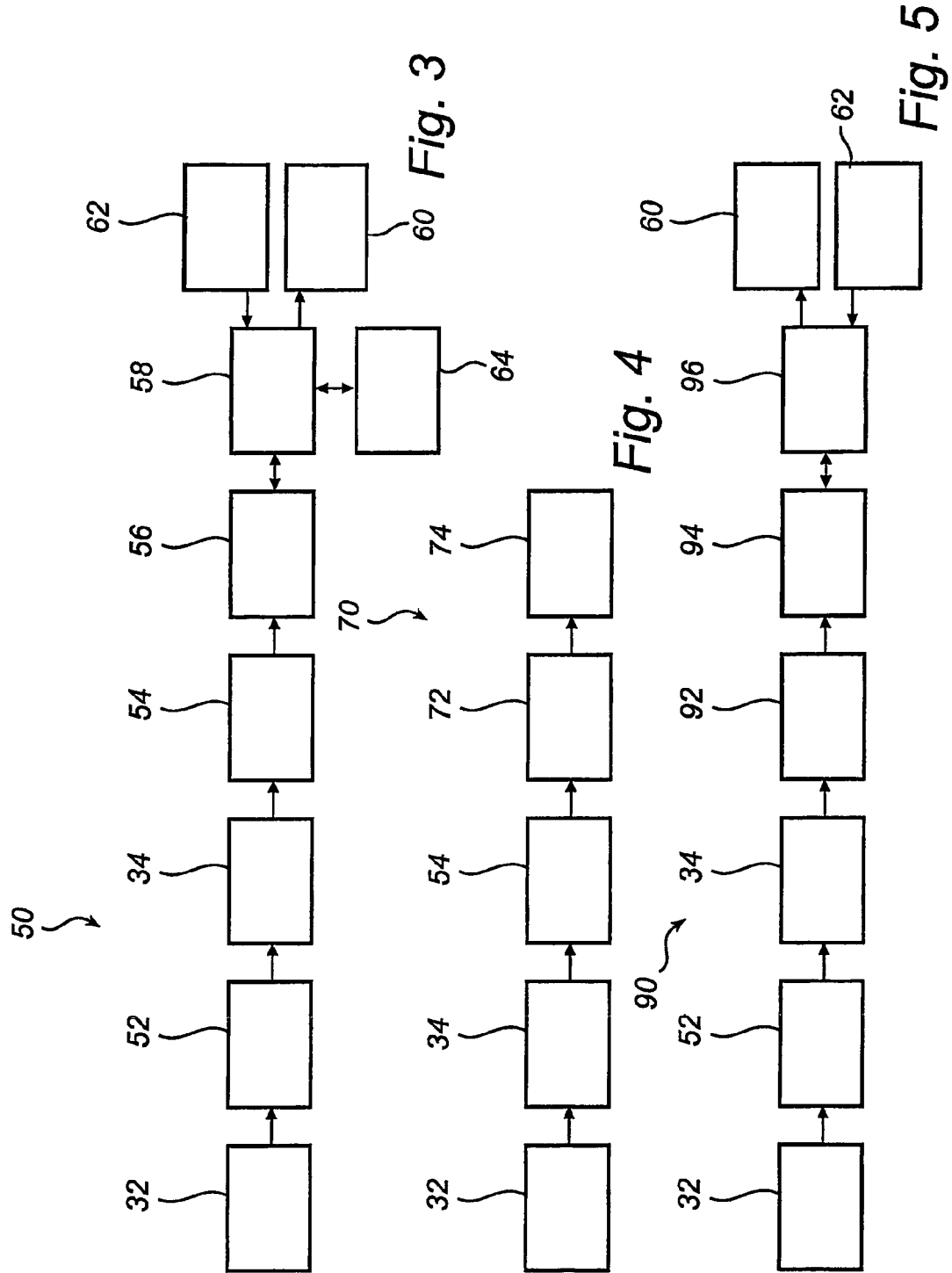

METHOD AND DEVICE FOR INDICATING AN ELECTRIC DISCHARGE INSIDE A BEARING OF AN ELECTRIC DRIVE SYSTEM

CONTINUING DATA

This application is a 371 of PCT/SE2007/000231 Mar. 12, 2007.

FIELD OF THE INVENTION

The present invention relates to a method and device for indicating an electric discharge inside a bearing of an electric drive system. In particular, it relates to a method and device for indicating an electric discharge in a non-conducting medium between a rolling element and a raceway in a bearing of an electric drive system.

BACKGROUND OF THE INVENTION

The operation of electric drive systems, especially AC systems such as an AC motor or a generator or a driven unit connected to an AC motor, is often hampered by so-called bearing currents. In motors, the internal voltage division of the common mode voltage over the internal stray capacitances of the motor may cause shaft voltages high enough to create high frequency bearing current pulses. This can happen if the shaft is not earthed via the driven machinery while the motor frame is earthed in the standard way for protection. The bearing current pulses, namely electric discharges taking place in the lubricating oil film between the ball and the races of the bearing, cause erosion of the race. As a result, the bearing may need replacing after only a short time in service. This issue is addressed in for example the document 'Technical Guide No. 5—Bearing Currents in Modern AC Drive Systems', ABB Automation Group Ltd., 1999, as well as the document WO2005/034314.

Of course, it is essential to be able to detect and/or measure the bearing currents in order to prevent the bearings of an electric drive system from breaking down and to take measures for avoiding the bearing currents. In the above mentioned document from ABB Automation Group Ltd., it is suggested to measure bearing currents using a specially designed, flexible, air-cored, Rogowski-type current sensor, which sensor is used to measure the current directly at certain measurement points within an AC motor. However, a drawback with this solution is that in order to reach the required measurement points within the AC motor, the AC motor has to be stopped and/or at least partly dismantled, which is cumbersome and time consuming and has to be carried out by experienced and dedicated personnel.

SUMMARY OF THE INVENTION

It is therefore an object of the present invention to overcome this drawback, and to provide an improved method for indicating bearing currents, which method in particular is easy to carry out.

These and other objects that will be evident from the following description are achieved by means of a method for indicating an electric discharge in a non-conducting medium between a rolling element and a raceway in a bearing of an electric drive system, as well as a corresponding indication device, according to the appended claims.

According to an aspect of the invention, there is provided a method for indicating an electric discharge in a non-conducting medium between a rolling element and a raceway in a bearing of an electric drive system, comprising: remotely detecting radio frequency signals emitted from the electric drive system, which signals comprise a radio frequency signal associated with an electrical discharge in the non-conducting medium, processing the detected radio frequency signals to estimate the electric discharge, and indicating the estimated electric discharge.

The invention is based on the understanding that bearing currents can be detected and/or measured by indicating the electric discharges within the bearing. The electric discharges give rise to a characteristic radio frequency signal, which radio frequency signal remotely can be detected, for example by means of an antenna, without interfering with the electric drive system or its operation. Thus, by remotely detecting the characteristic radio frequency signal, there is no need of accessing measurement points within the electric drive system, which greatly facilitates indication of bearing currents.

The electric drive system can be an adjustable or variable speed drive system with motor, converter, and control system. In particular, the electric drive system can be an AC system, such as an AC motor or a generator or a unit connected to an AC motor, such as a gearbox, pump, compressor, etc.

It should be noted that measuring radio frequency signals for detecting an event in for example an electric motor is known per se. For instance the document WO03/060536 discloses an electric motor monitoring system comprising an antenna to detect high frequency signals. However, the detected high frequency signals in WO03/060536 relate to arcing events (i.e. a luminous phenomenon) from a brush contact of the DC motor, rather than electric discharges (electrical conduction) specifically within the bearing.

The radio frequency signal associated with the electric discharge from within the bearing should exhibit at least one of: being a non-repetitive signal, being shorter than 200 ns, and having a frequency spectra within 50 MHz-8 GHz range. More particularly, it should be a non-repetitive signal, shorter than 100 ns and/or have a frequency spectrum within 50 MHz-1 GHz range. If a signal having these characteristics is detected, it is highly likely that it is a signal associated with the electric discharge. Therefore, these characteristics are advantageously used during the processing of the detected radio frequency signals in order to estimate the electric discharge.

In one embodiment, detecting radio frequency signals comprises detecting a magnetic field associated with the electrical discharge using a magnetic field sensor. Detecting a magnetic field associated with the electrical discharge is advantageous since the magnetic field is directly proportional to the electric discharge current, thereby allowing straightforward estimation of the magnitude of the electric discharge current.

Preferably, the magnetic field sensor comprises a closed loop antenna. Also preferably, the antenna is a wide band antenna with low Q factor. The bandwidth of the antenna can for example be between about 50 MHz and 8 GHz, specifically between about 50 MHz and 1 GHz, to detect the magnetic field associated with the electric discharge and filter out other irrelevant signals, and the Q factor can be selected so that a flat sensor response is achieved, to allow correct estimation of the detected signal.

In another embodiment, detecting radio frequency signals comprises detecting an electric field associated with the electrical discharge using an electric field sensor. When the electric discharge occurs in the non-conducting medium, current starts to flow through the bearing, causing a voltage levelling out in the electric drive system. This voltage levelling out or voltage change in turn causes an electric field variation thus associated with the electric discharge, and by detecting the associated electric field the electrical discharge can be indicated.

In yet another embodiment, processing of the detected radio frequency signals comprises verifying the electric discharge estimated from the detected magnetic field by means of the detected electric field. That is, an electric discharge is only indicated if both a magnetic field associated with the discharge and an electric field associated with the discharge are detected essentially simultaneously. This verification is advantageous since unintended detection of a magnetic field similar to the magnetic field associated with the electric discharge otherwise could result in a false indication. The method according to this embodiment thus offers redundant detection.

The processing of the detected radio frequency signals can further comprise filtering the detected radio frequency signals to reduce non-discharge noise. The processing can for example be carried out using a high pass filter, which filters out lower frequency noise. This facilitates the detection of the radio frequency signal associated with the electric discharge and the estimation of the electric discharge.

Further, the method can comprise comparing the estimated electric discharge to a preset threshold, wherein the indication of the estimated electric discharge is carried out if the estimated electric discharge exceeds the preset threshold. The indication in this case is advantageously an alarm, which warns an operator that a certain electric discharge has occurred.

According to another aspect of the present invention, there is provided a device for indicating an electric discharge in a non-conducting medium between a rolling element and a raceway in a bearing of an electric drive system, comprising: means for remotely detecting radio frequency signals emitted from the electric drive system, which signals comprises a radio frequency signal associated with an electrical discharge in the non-conducting medium, means for processing the detected radio frequency signals to estimate the electric discharge, and means for indicating the estimated electric discharge. This aspect of the invention exhibits similar advantages as the previously discussed aspect of the invention.

The electric drive system can for example be an adjustable or variable speed drive system with optional frequency converter. In particular, the electric drive system can be an AC system, such as an AC motor or a generator or a unit connected to an AC motor, such as a gearbox, pump, compressor, etc.

The radio frequency signal associated with the electric discharge from within the bearing should exhibit at least one of: being a non-repetitive signal, being shorter than 200 ns, and having a frequency spectra within 50 MHz-8 GHz range. More specific, it should be a non-repetitive signal, shorter than 100 ns and/or have a frequency spectra within 50 MHz-1 GHz range. If a signal having these characteristics is detected by the detection means, it is highly likely that it is a signal associated with the electric discharge. Therefore, these characteristics are advantageously used by the processing means in order to estimate the electric discharge.

In one embodiment, the means for detecting radio frequency signals comprises a magnetic field sensor for detecting a magnetic field associated with the electrical discharge. Preferably, the magnetic field sensor comprises a closed loop antenna. Also preferably, the antenna is a wide band antenna with low Q factor.

In another embodiment, the means for detecting the radio frequency signals comprises an electric field sensor for detecting an electric field associated with the electrical discharge.

In yet another embodiment, the means for processing the detected radio frequency signals is adapted to verify the electric discharge estimated from the detected magnetic field by means of the detected electric field. That is, an electric discharge is only indicated if both a magnetic field associated with the discharge and an electric field associated with the discharge are detected essentially simultaneously.

The means for processing the detected radio frequency signals can further comprise means for filtering the detected radio frequency signals, such as a high pass filter, to reduce non-discharge noise.

Further, the device can comprise comprising means for comparing the estimated electric discharge to a preset threshold, wherein the means for indicating the estimated electric discharge is actuated if the estimated electric discharge exceeds the preset threshold.

SHORT DESCRIPTION OF THE DRAWINGS

These and other aspects of the present invention will now be described in more detail, with reference to the appended drawings showing currently preferred embodiments of the invention. The same elements are designated correspondingly throughout the figures.

Figure 2:
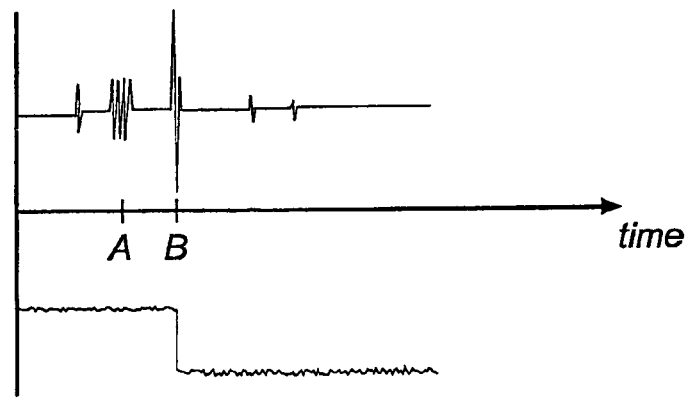

FIG. 1 schematically illustrates an electric drive system and a device for indicating discharges according to an embodiment of the invention, FIG. 2 illustrates outputs from a magnetic field sensor and an electric field sensor, FIG. 3 is a block diagram of a device for indicating discharges according to another embodiment of the invention, FIG. 4 is a block diagram of a device for indicating discharges according to yet another embodiment of the invention, and FIG. 5 is a block diagram of a device for indicating discharges according to still another embodiment of the invention.

DETAILED DESCRIPTION OF PREFERRED EMBODIMENTS

FIG. 1 schematically illustrates an electric drive system, namely an AC drive system 10, and a device 30 for indicating discharges according to an embodiment of the invention. More specific, FIG. 1 includes a partial cross sectional view of the AC system 10 and a block diagram of the device 30.

The AC system 10 can for example be an AC motor or a generator or a unit connected to an AC motor, such as a gearbox, pump, compressor, etc. The AC system 10 comprises a bearing 12, here arranged on a shaft 14. The bearing 12 in turn includes in a known manner an inner raceway 16, an outer raceway 18, and several rolling elements 20. The rolling element 20 can for example be a roller or a ball. Between each rolling element 20 and the raceways 16, 18 there is a non-conducting medium 22, such as a lubricant, for example a lubricating oil film. As discussed above, electric discharges can take place in the lubricant 22, whereby current starts to flow through the bearing 12, causing erosion of the raceways 16, 18. The electric discharge in the lubricant 22 is indicated with a "flash" in FIG. 1 (which flash is exaggerated in FIG. 1 for reasons of clarity).

According to the invention, the electric discharge can be indicated using for example the device 30 in FIG. 1. Other suitable devices will be illustrated in subsequent figures.

The device 30 comprises a magnetic field sensor 32 coupled to a high pass filter 34, which in turn is coupled to a digital storage oscilloscope 36. An electric field sensor 38 can optionally be coupled to the oscilloscope 36.

When an electric discharge occurs in the bearing 12, it generates a magnetic field. By arranging the device 30 in the vicinity of the AC system 10, this magnetic field can be detected by the magnetic field sensor 32 of the device 30. The magnetic field sensor 32 preferably comprises a closed loop wide band antenna with low Q factor. More specific, the magnetic field sensor 32 should have a frequency range of about 50 MHz to 8 GHz, in particular 50 MHz-1 GHz, to detect the magnetic field associated with the electric discharge and filter out other irrelevant signals. Further, the antenna should preferably be oriented in such a way as to ensure maximum coupling. Also, the whole magnetic field sensor 32 should preferably be shielded to minimize any electric field influence. Alternatively, it is possible to detect an electromagnetic field associated with the electrical discharge using an substantially unshielded electromagnetic field sensor and estimate the electric discharge therefrom.

The signal of the magnetic field detected by the magnetic field sensor 32 is then filtered by means of the high pass filter 34, to filter out lower frequency noise from for example surrounding equipment or switching gear using semiconductor components, before it is passed on to the oscilloscope 36, where the detected signal can be indicated to an operator by means of the oscilloscope's display.

Here, the operator can manually examine the detected signal in order to estimate the electric discharge. First, the operator can estimate the shear occurrence of an electric discharge based on the characteristics of a signal associated with an electric discharge within a bearing. Such a signal should be a non-repetitive signal, it should be shorter than 200 ns, and it should be in the frequency range 50 MHz-8 GHz. In particular, it should be a non-repetitive signal, shorter than 100 ns, and/or in the frequency range 50 MHz-1 GHz. If the operator establishes that the detected signal fulfils these criteria, the operator then estimates that an electric discharge has occurred.

Second, the operator can estimate the magnitude of the electric discharge current. The magnetic field associated with the electrical discharge is directly proportional to the electric discharge current. Thus, by measuring the magnetic field strength, the magnitude of the electric discharge current can easily be estimated by a simple calculation. The low Q factor of the magnetic field sensor 32, which provides for a flat sensor response, ensures correct estimation of the electric discharge current.

As an alternative to the manual operation described above, the output of the oscilloscope 36 can be transmitted to a computer device 40 for automatic estimation of the electric discharge, based on the characteristics of signals associated with electric discharges presented above and the magnetic field strength, as well as for further processing, analysis, and storage. Further processing and analysis can include perform discharge counting, estimate discharge time and approximate discharge energy, etc. The computer device 40 can advantageously comprise an output device, such as a display, for indicating the discharge and related data. In this case, the computer device 40 both processes the detected signal and indicates the estimated discharge. The computer device 40 can also advantageously implement an alarm system wherein a warning is issued if for example the discharge count or discharge magnitude exceeds a preset threshold.

The output of the optional electric field sensor 38 can advantageously also be taken into account in the manual or automatic estimation of the electric discharge. When the electric discharge occurs in lubricant, current starts to flow through the bearing, whereby the voltage of the AC system's shaft (which is connected to the bearing) changes. This rapid voltage change causes an electric field variation thus associated with the electric discharge, which advantageously can be used for verification as will be explained below in relation to FIG. 2.

FIG. 2 shows exemplary outputs from the magnetic field sensor 32 (top) and the electric field sensor 38 (bottom), respectively. The magnetic field signal pulse at A has too long duration and too narrow frequency spectra to be classified as originating from an electric discharge. Thus, an electric discharge is not indicated at A. However, at B, the magnetic field signal pulse has a duration and frequency which falls within the above characteristics of a signal associated with an electric discharge. Also, at the same point in time, there is a significant rapid change in shaft voltage (whereas at point A there is no change in voltage). This change in voltage verifies the above assumption based on the magnetic field that there is an electric discharge at B. Consequently, an electric discharge is estimated and indicated at B. In the automatic estimation, a condition can advantageously be set up that an electric discharge is only estimated and thus indicated if both an magnetic field and an electric field associated with the electric discharge are detected.

It should be noted that the output from the electric field sensor 38 could be used alone to estimate the electric discharge. However, the electric field is not directly proportional to the electric discharge current, whereby it is preferred to use the magnetic field as a starting point to estimate the electric discharge.

FIG. 3 is a block diagram of a device 50 for indicating an electric discharge in a non-conducting medium between a rolling element and a raceway in a bearing of an electric drive system, such as the system 10 in FIG. 1, according to another embodiment of the invention.

The device 50 comprises a magnetic field sensor 32, a matching network 52, a high pass filter 34, a logarithmic detector 54, a sample and hold amplifier 56, and a micro controller 58 with integrated analog-to-digital converter (ADC), all connected in series.

Upon operation, a radio frequency signal captured by the magnetic field sensor 32 passes through the matching network 52, which is used to convert the impedance of the antenna of the magnetic field sensor 32 to a desired impedance, such as 50Ω, and the high pass filter 34 as above. The log detector 54 then converts the radio frequency signal input to a corresponding decibel-scaled output voltage. The logarithmic detector 54 advantageously has a short response time of about 10-15 ns, which is suitable for detecting the "rapid" electric discharges. However, in order to provide enough time for the ADC in the micro controller 58 to convert the analog signal to digital form, the sample and hold amplifier 56 is used. The sample and hold amplifier 56 stores the output voltage of the logarithmic detector 54 and keeps it until the ADC has finished its conversion, whereupon the micro controller 58 resets the sample and hold amplifier 56. Instead of the sample and hold amplifier 56, a peak detector could alternatively be used. Except for controlling the device, the micro controller 58 can perform processing functions similar to those of the computer device 40 above, in order to estimate the electric discharge, here based on the digitalized version of the detected signal.

The micro controller 58 is further advantageously connected to an output device 60 such as a display for allowing indication of the detected electric discharge and other data, an input device 62 such as a keyboard for allowing an operator to input instructions to the micro controller, and a memory 64 for storing data related to the detected signals.

FIG. 4 is a block diagram of a device 70 for indicating an electric discharge in a non-conducting medium between a rolling element and a raceway in a bearing of an electric drive system, such as the system 10 in FIG. 1, according to yet another embodiment of the invention.

The device 70 is a simplified version of the device 50 shown in FIG. 3, and it comprises a magnetic field sensor 32, a high pass filter 34, a logarithmic detector 54, a threshold circuit 72, and an alarm 74, all connected in series. As above, the detected signal is filtered and converted to an output voltage, which is supplied to the threshold circuit 72 comprising a preset threshold. When the output voltage exceed the preset threshold, the alarm 74 is activated to indicate the electric discharge. The preset threshold selected so that there is no false discharge indication, in accordance with the characteristics of signals associated with the electric discharges in question as discussed above. Instead of the logarithmic detector 54, a peak detector could alternatively be used.

FIG. 5 is a block diagram of a device 90 for indicating an electric discharge in a non-conducting medium between a rolling element and a raceway in a bearing of an electric drive system, such as the system 10 in FIG. 1, according to yet another embodiment of the invention.

The device 90 comprises a magnetic field sensor 32, a matching network 52, a high pass filter 34, an analog-to-digital converter 92, a memory 94, and a micro controller 96, all connected in series. An output device 60 (e.g. a display) and an input device 62 (e.g. a keyboard) are also connected to the micro controller 96. In this device 90, real time analog-to-digital conversion of the detected and filtered radio frequency signal can be performed using a >2 GS/s ADC 92. The memory 94 functions as a data buffer. The overall function of the micro controller 96 is similar to that of the micro controller 58.

The person skilled in the art realizes that the present invention by no means is limited to the preferred embodiments described above. On the contrary, many modifications and variations are possible within the scope of the appended claims. For example, an electric field sensor for verifying the detected electric discharge as described in relation to FIGS. 1 and 2 can also be incorporated in the devices shown in FIGS. 3-5.

The invention claimed is:

1. A method for estimating an occurrence of an electrical discharge in a lubricant between a rolling element and a raceway in a bearing of an electric drive system, the method comprising:
   remotely detecting radio frequency signals emitted from the electric drive system;
   filtering the radio frequency signals remotely detected to exclude radio frequency signals that may be associated with surrounding equipment or a gear box of the electric drive system;
   processing the filtered radio frequency signals to determine if they are non-repetitive, and have a frequency spectra within a range of 50 MHz-8 GHz, and have a duration shorter than 200 ns;
   estimating that an electrical discharge has occurred in the lubricant between the rolling element and the raceway in the bearing of the electric drive system in response to a determination that the filtered radio frequency signals are non-repetitive, and have a frequency spectra within a range of 50 MHz-8 GHz and have a duration shorter than 200 ns as these parameters are indicative of the occurrence of the electrical discharge in the lubricant between the rolling element and the raceway in the bearing of the electric drive system, and
   not estimating that an electrical discharge has occurred in the lubricant between the rolling element and the raceway in the bearing of the electric drive system in response to a determination that the filtered radio frequency signals have a frequency spectrum outside the range of 50 MHz-8 GHz and have a duration longer than 200 ns.

2. The method according to claim 1, wherein
   the processing is to determine if the filtered radio frequency signals have a frequency spectra within a range of 50 MHz-1 GHz and a duration shorter than 100 ns; and
   the estimating is to estimate the occurrence of the electrical discharge in the lubricant between the rolling element and the raceway in the bearing of the electric drive system when the processing determines the filtered radio frequency signals have a frequency spectra within a range of 50 MHz-1 GHz and a duration shorter than 100 ns as these parameters are further indicative of the occurrence of the electrical discharge in the lubricant between the rolling element and the raceway in the bearing of the electric drive system.

3. The method according to claim 1, wherein the remotely detecting radio frequency signals includes detecting a magnetic field emitted from the electric drive system.

4. The method according to claim 1, wherein
   the remotely detecting includes
   remotely detecting a magnetic field emitted from the electric drive system; and
   remotely detecting an electric field emitted from the electric drive system;
   the filtering includes filtering the magnetic field remotely detected to exclude magnetic field signals that may be associated with surrounding equipment or a gear box of the electric drive system;
   the processing includes
   determining if the filtered magnetic field is non-repetitive, and has a frequency spectra within the range of 50 MHz-8 GHz, and has a duration shorter than 200 ns; and
   determining if the electric field remotely detected has a significant rapid voltage change that is detected essentially simultaneously with a portion of the filtered magnetic field that is non-repetitive, and has a frequency spectra within the range of 50 MHz-8 GHz, and has a duration shorter than 200 ns; and
   the estimating includes only estimating an occurrence of an electrical discharge in the lubricant between the rolling element and the raceway in the bearing of the electric drive system when the processing determines the filtered magnetic field is non-repetitive, and has a frequency spectra within a range of 50 MHz-8 GHz, and has a duration shorter than 200 ns and the significant rapid voltage change is detected essentially simultaneously with the portion of the magnetic field remotely detected that is non-repetitive, and has a frequency spectra within the range of 50 MHz-8 GHz, and has a duration shorter than 200 ns.

5. The method according to claim 1, further comprising
counting a number of estimated occurrences of the electrical discharge in the lubricant between the rolling element and the raceway in the bearing of the electric drive system;
comparing the number of estimated occurrences to a defined threshold; and
indicating when the defined threshold has been exceeded.

6. The method according to claim 1, further comprising
calculating a magnitude of the estimated occurrence of the electrical discharge in the lubricant between the rolling element and the raceway in the bearing of the electric drive system;
comparing the calculated magnitude to a defined threshold; and
indicating when the defined threshold has been exceeded.

7. A device for estimating an occurrence of an electrical discharge in a lubricant between a rolling element and a raceway in a bearing of an electric drive system, comprising:
a magnetic field sensor configured to remotely detect a magnetic field emitted from the electric drive system; and
a signal characteristic determining processor configured to
determine when the magnetic field remotely detected includes magnetic field signals having parameters indicative of an electrical discharge in the lubricant between the rolling element and the raceway in the bearing of the electric drive system, and
produce an output to signal that an occurrence of an electrical discharge in the lubricant has occurred when the magnetic field signals are non-repetitive and have a frequency spectra within a range of 50 MHz-8 GHz and have a duration shorter than 200 ns and not produce an output to signal that an occurrence of an electrical discharge in the lubricant has occurred when the magnetic field signals have a frequency spectra outside the range of 50 MHz-8 GHz and have a duration longer than 200 ns.

8. The device of claim 7, further comprising a filter to exclude magnetic field signals that may be associated with surrounding equipment or a gear box of the electric drive system.

9. The device of claim 7, further comprising an electric field sensor to remotely detect an electric field emitted from the electric drive system, wherein the signal characteristic determining processor is further configured to
determine if the detected electric field exhibits a significant rapid voltage change associated with the magnetic field signals having the indicative parameters; and
verify the occurrence of the electrical discharge only if there is a significant rapid voltage change in the electric field detected substantially simultaneously with the magnetic field signals having the parameters indicative of an electrical discharge in the lubricant.

10. The device of claim 7, wherein the signal characteristic determining processor is further configured to
perform at least some subset of counting estimated occurrences of an electrical discharge, estimating electrical discharge time and estimating electrical discharge energy; and
provide notification when at least some subset of the electrical discharge count and the estimated electrical discharge energy exceed associated thresholds.

11. The device of claim 7, wherein the signal characteristic determining processor is further configured to estimate a magnitude of current of the estimated occurrence of the electrical discharge based on measured field strength of the magnetic field.

12. A method for indicating an electric discharge in a lubricant between a rolling element and a raceway in a bearing of an electric drive system, comprising:
remotely detecting radio frequency signals emitted from the electric drive system,
processing the detected radio frequency signals to determine whether the detected radio frequency signals include a radio frequency signal shorter than 200 ns and having a frequency spectra within a 50 MHz-8 GHz range,
indicating the electric discharge if the radio frequency signals include the radio frequency signal shorter than 200 ns, and having a frequency spectra within a 50 MHz-8 GHz range and not indicating the electric discharge if the radio frequency signal is longer than 200 ns and has a frequency spectra outside the 50 MHz-8 GHz range.

13. The method according to claim 12, wherein the radio frequency signal shorter than 200 ns and having a frequency spectra within the 50 MHz-8 GHz range is also shorter than 100 ns and has a frequency spectra within a 50 MHz-1 GHz range.

14. The device according to claim 7, wherein the parameters include magnetic field signals that are non-repetitive and have a frequency spectra within a range of 50 MHz-1 GHz and have a duration shorter than 100 ns and wherein the processor is configured to produce an output to signal that the occurrence of an electrical discharge in the lubricant has occurred when the magnetic field signals are non-repetitive and have a frequency spectra within a range of 50 MHz-1 GHz and have a duration shorter than 100 ns.

15. The method according to claim 12, wherein indicating the electric discharge comprises indicating the electric discharge if the radio frequency signals are shorter than 100 ns and have a frequency spectra within 50 MHz-1 GHz range.

16. The method according to claim 12, wherein electric discharge is indicated only if a change in an electric field is detected essentially simultaneously with the radio frequency signal shorter than 200 ns and having a frequency spectra within the 50 MHz-8 GHz range.

17. A device for estimating an occurrence of an electrical discharge in a lubricant between a rolling element and a raceway in a bearing of an electric drive system, comprising:
a magnetic field sensor configured to remotely detect a magnetic field emitted from the electric drive system; and
a signal characteristic determining processor configured to
determine when the magnetic field remotely detected includes magnetic field signals having parameters indicative of an electrical discharge in the lubricant between the rolling element and the raceway in the bearing of the electric drive system and to produce an output to signal that an occurrence of an electrical discharge in the lubricant has occurred in response to a determination that the magnetic field signals have a frequency spectra within a range of 50 MHz-8 GHz and have a duration shorter than 200 ns and to not produce an output to signal that an occurrence of an electrical discharge in the lubricant has occurred in response to a determination that the magnetic field signals have a frequency spectra outside the range of 50 MHz-8 GHz and have a duration longer than 200 ns.

18. The device according to claim 17, wherein the signal characteristic determining processor is configured to produce an output to signal that an occurrence of an electrical discharge in the lubricant has occurred in response to a determination that the magnetic field signals have a frequency spectra within a range of 50 MHz-1 GHz and have a duration shorter than 100 ns and to not produce an output to signal that an occurrence of an electrical discharge in the lubricant has occurred in response to a determination that the magnetic field signals have a frequency spectra outside the range of 50 MHz-1 GHz and have a duration longer than 100 ns.

19. The device according to claim 17, wherein the signal characteristic determining processor is configured to produce an output to signal that an occurrence of an electrical discharge in the lubricant has occurred only if a change in an electric field is detected essentially simultaneously with the radio frequency signals having a frequency spectra within the range of 50 MHz-8 GHz and a duration shorter than 200 ns.

* * * * *